(12) United States Patent
Fuessel et al.

(10) Patent No.: US 10,809,281 B2
(45) Date of Patent: Oct. 20, 2020

(54) SYSTEMS AND METHODS TO GROUND A CURRENT SENSOR

(71) Applicant: Bell Helicopter Textron Inc., Fort Worth, TX (US)

(72) Inventors: David W. Fuessel, Euless, TX (US); Russel Mark Berkley, Hurst, TX (US)

(73) Assignee: BELL HELICOPTER TEXTRON INC., Fort Worth, TX (US)

( * ) Notice: Subject to any disclaimer, the term of this patent is extended or adjusted under 35 U.S.C. 154(b) by 90 days.

(21) Appl. No.: 16/118,283

(22) Filed: Aug. 30, 2018

(65) Prior Publication Data

US 2020/0072867 A1    Mar. 5, 2020

(51) Int. Cl.
*G01R 1/04* (2006.01)
*G01R 31/00* (2006.01)

(52) U.S. Cl.
CPC ............. *G01R 1/04* (2013.01); *G01R 31/008* (2013.01)

(58) Field of Classification Search
None
See application file for complete search history.

(56) References Cited

U.S. PATENT DOCUMENTS

| 5,718,598 | A | * | 2/1998 | Saka | H01R 9/2458 439/404 |
| 2002/0051906 | A1 | * | 5/2002 | Wakata | G01R 31/364 429/178 |
| 2008/0030208 | A1 | * | 2/2008 | Aratani | G01R 1/203 324/713 |
| 2015/0097590 | A1 | * | 4/2015 | Bondurant | G01N 29/223 324/700 |

* cited by examiner

*Primary Examiner* — Jas A Sanghera
(74) *Attorney, Agent, or Firm* — Pramudji Law Group PLLC; Ari Pramudji

(57) ABSTRACT

A support bracket for grounding a current sensor is disclosed. The support bracket comprises a first surface and a second surface. The first surface is electrically coupled to a current sensor to provide a current path to ground the current sensor. The second surface is physically coupled to the current sensor in order to support the current sensor.

21 Claims, 4 Drawing Sheets

SYSTEMS AND METHODS TO GROUND A CURRENT SENSOR

BACKGROUND

Airframe design incorporates engineering, aerodynamics, materials technology, and manufacturing methods to achieve favorable balances of performance, reliability, and cost. Existing airframe design of aircrafts (e.g., rotorcrafts) include current sensors (i.e., electrical shunts) that are mounted to various locations on the aircraft airframe to measure current provided from power generators. However, to ground current from these current sensors, for each current sensor, an additional electrical feeder cable assembly is needed to route between the various current sensor locations and ground tabs that are positioned on the peripheral edges of an aircraft airframe. For economical and efficient use of space proximate the aircraft airframe, limiting the number of components promotes optimal airframe design.

SUMMARY

According to one implementation of the present disclosure, a support bracket includes a first surface and a second surface. The first surface may be electrically coupled to a current sensor to provide a current path to ground the current sensor. The second surface may be physically coupled to the current sensor in order to support the current sensor.

According to another implementation of the present disclosure, a system includes a vehicle chassis, a current sensor, and a support bracket. The support bracket may physically and electrically couple the current sensor to the vehicle chassis in order to support and provide a current path to ground the current sensor.

According to another implementation of the present disclosure, a method includes securing the current sensor to a support bracket, securing the support bracket to a vehicle chassis, and enabling the support bracket to conduct current between the current sensor and the vehicle chassis.

The above-referenced summary section is provided to introduce a selection of concepts in a simplified form that are further described below in the detailed description section. Additional concepts and various other implementations are also described in the detailed description. The summary is not intended to identify key features or essential features of the claimed subject matter, nor is it intended to be used to limit the scope of the claimed subject matter, nor is it intended to limit the number of inventions described herein. Furthermore, the claimed subject matter is not limited to implementations that solve any or all disadvantages noted in any part of this disclosure.

BRIEF DESCRIPTION OF THE DRAWINGS

Implementations of various techniques will hereafter be described with reference to the accompanying drawings. It should be understood, however, that the accompanying drawings illustrate only the various implementations described herein and are not meant to limit the scope of various techniques described herein.

DETAILED DESCRIPTION

In one or more aspects of the present disclosure, a support bracket 100, a system 1000, and a method 2000 promote low cost, efficient, and correct installation of current sensors (i.e., current sensor shunts, electrical shunts) to respective support brackets on various locations of an airframe chassis (airframe) of an aircraft. One skilled in the art would appreciate that the inventive aspects described and claimed herein are not limited to aircrafts solely but may be implemented in many other environments. The environments include, without limitation: boats, submarines, and other watercraft vehicles, cars, trucks, trains, and other land-operating vehicles, both manned and unmanned, etc.

With better organization, savings may be realized such that a feeder cable assembly (i.e., a feeder wire terminal) from a current sensor shunt to a separate grounding tab may be eliminated. Hence, the removal of the additional feeder wire terminals promotes greater economy in the organization of the aircraft chassis. Furthermore, by not having to attach current sensor shunts to separate brackets and grounding tabs/modules, various grounding tabs/modules may also be eliminated. Additionally, as the current sensor shunts would have no direct contact with the airframe, additional drilling of holes on the airframe to mount current sensor shunts directly thereupon may also be prevented as well.

In an example rotorcraft, current sensor shunts are desired for each of the power sources (e.g., main power generators). In an example aircraft having two main generators, a power converter, a starter generator, and a battery, savings may be realized by eliminating at least four ground feeder wire terminals.

Figure 1:
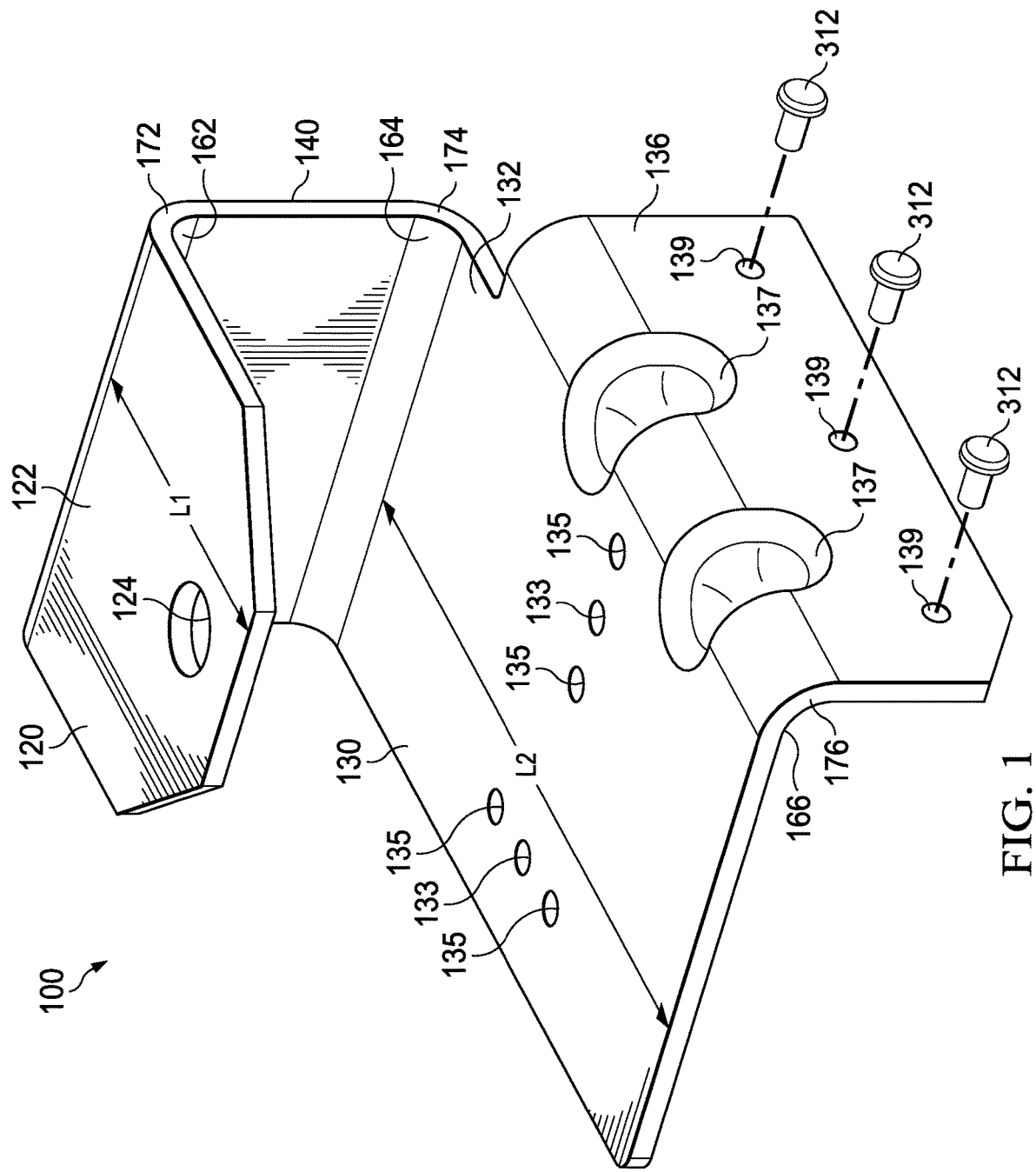
FIG. 1 illustrates a support bracket in accordance with implementations of various techniques described herein.

Referring to FIG. 1, a support bracket 100 implementable to ground a current sensor 200 is shown. The support bracket 100 may include a first surface 120 (i.e., a first section), a second surface 130 (i.e., a second section), and a third surface 140 (i.e., a third section). In a particular implementation, a first portion 122 of the first surface 120 may be substantially parallel to a second portion 132 of the second surface 130. The third surface 140 may be arranged as a connecting surface of the first and second surfaces 120,130.

The parallel first and second portions 122, 132 of the first and second surfaces 120, 130 provide planar alignment of the support bracket 100 with a flat surface, such as that of a current sensor 200 and a vehicle chassis 300 (i.e., a chassis) (e.g., an airframe of an aircraft or rotorcraft). As described in below paragraphs, such planar alignment may be desired for aligning various fasteners to secure the current sensor 200 to the support bracket 100, and the support bracket 100 to the chassis 300. The current sensor 200 and the chassis 300 are described in greater detail with reference to FIGS. 2-3 in below paragraphs.

In a particular implementation, a second length (L2) of the second surface 130 of the support bracket 100 may be greater than a first length (L1) of the first surface 120. Moreover, the first and second lengths (L1, L2) may also be substantially parallel. Suitably, the current sensor 200 may be positioned above the second surface 130 and partially below the first surface 120. Hence, the first and second surfaces 120 and 130 may be coupled to opposing sides of the current sensor 200.

As mentioned herein, the term "parallel", as applied to lengths and/or surfaces, shall be defined as lengths and/or surfaces progressing so that the interval between them remains the same, within an applicable manufacturing tolerance. For example, the second portion 132 being parallel to the first portion 122 suggests that the second portion 132 and the first portion 122 are included in respective geometric planes that are parallel in space within an applicable manufacturing tolerance.

In certain implementations, the first, second and third surfaces 120, 130, 140 may be a single piece (i.e., a strip) of metal (e.g., aluminum) that is formed into a particular shape. In one such implementation, the first, second, and third surfaces 120, 130, 140 may form a first right angle 162 (i.e., a first bend 162) and a second right angle 164 (i.e., a second bend 164) to construct a half-rectangular shape. The first right angle 162 may be formed at an intersection of the first surface 120 and the third surface 140 and the second right angle 164 may be formed at an intersection of the second surface 130 and third surface 140. Hence, the third surface 140 may be substantially perpendicular to both first and second surfaces, 120, 130. Correspondingly, in such an implementation, the first right angle 162 forms a first metal corner 172 and the second right angle 164 forms a second metal corner 174. Also, the third surface 140 may be one continuous radius or bend in addition to the bends formed to construct first and second surfaces 120, 130.

Figure 2:
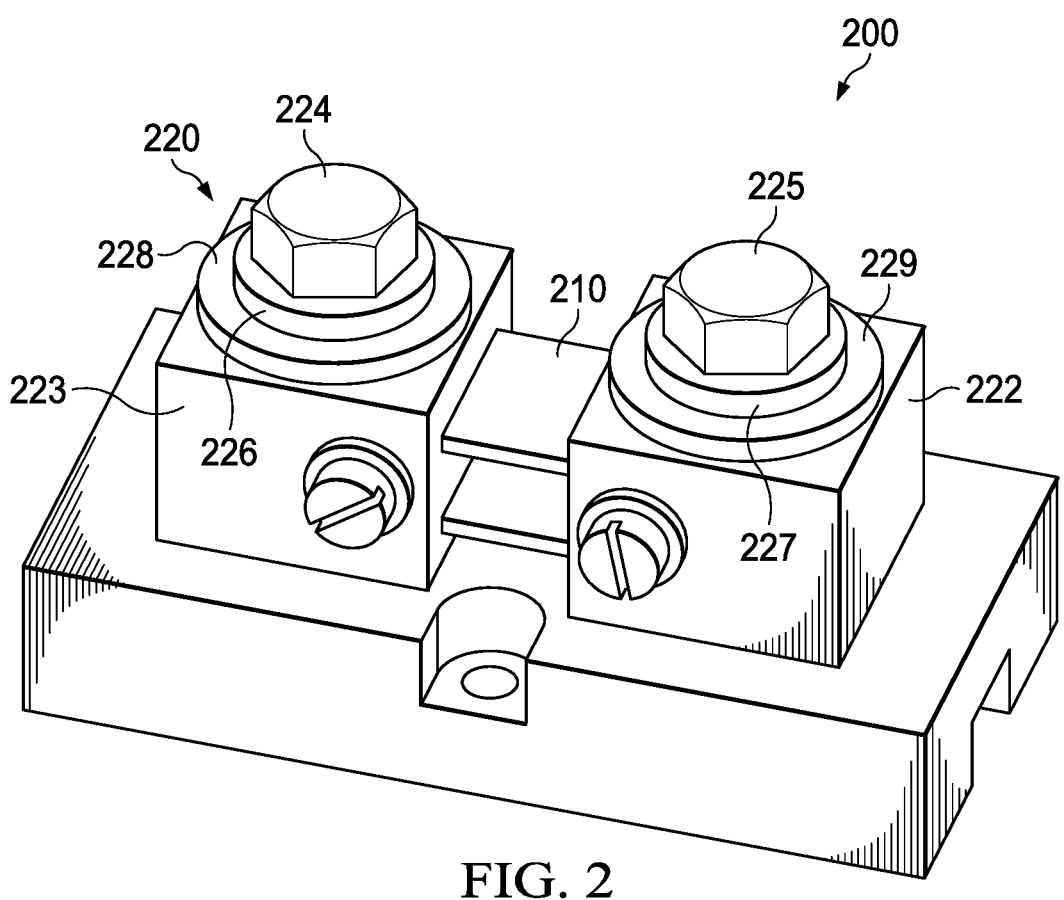
FIG. 2 illustrates a current sensor in accordance with implementations of various techniques described herein.
Figure 3:
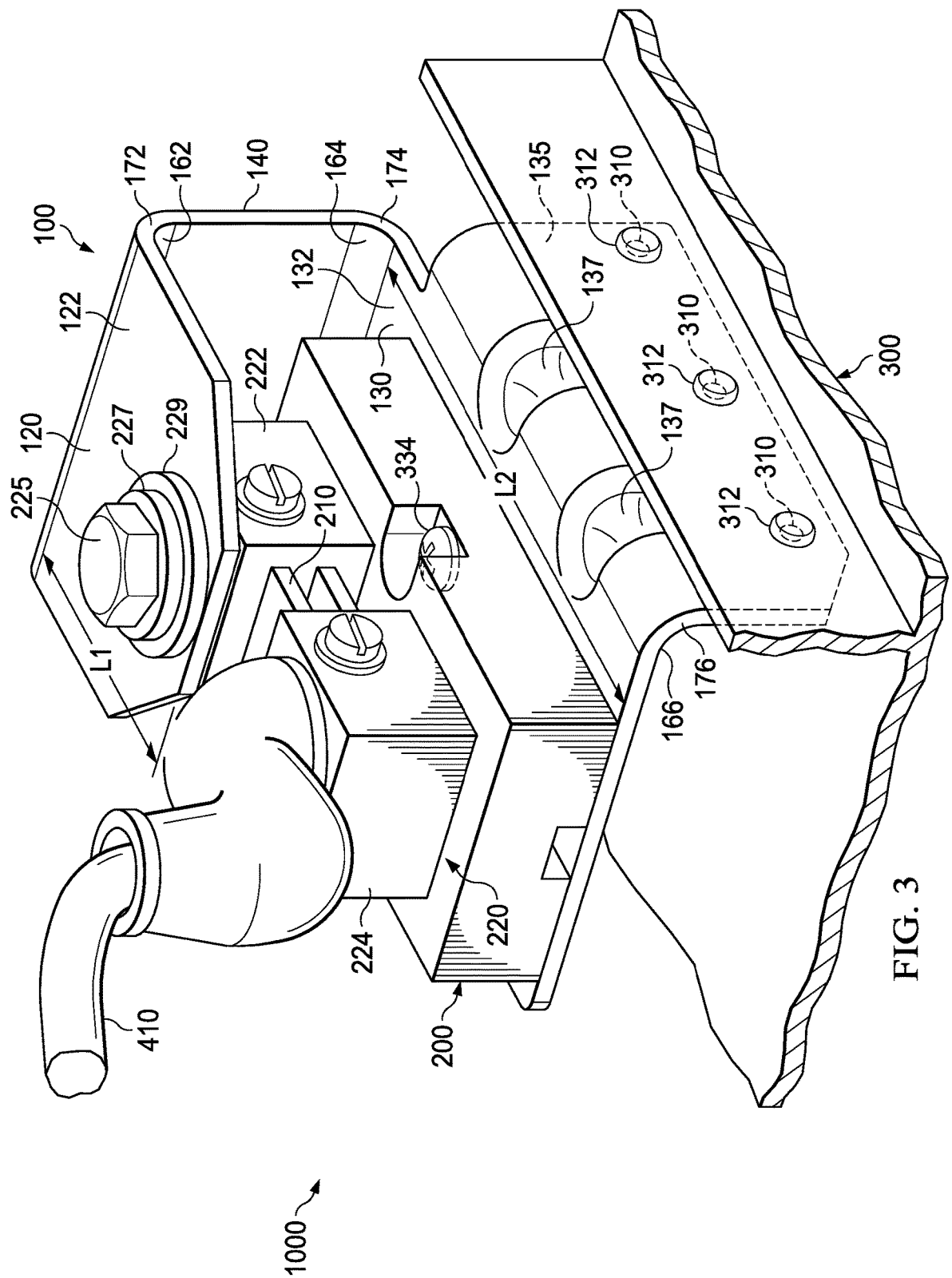
FIG. 3 illustrates a support bracket, a current sensor, and a chassis in accordance with implementations of various techniques described herein.

The first surface 120 may include an opening 124 (i.e., a through, circumferentially enclosed opening) (e.g., a circular hole) that is configured to receive a fastener (e.g., a bolt), lock washer, and/or flat washer (e.g., a second fastener 225 a second lock washer 227, and a second flat washer 229 as shown with reference to FIGS. 2 and 3) to adjoin and electrically couple the current sensor 200. In an example, the opening 124 may be formed as a circular hole (which may provide greater surface area than that of a "slot", and thus, provide better conductivity). Advantageously, the opening 124 provides an arrangement to secure the current sensor 200 and to provide a path to the support bracket 100 for current flowing through the current sensor 200.

In certain implementations, the first surface 120 may be a "tab" (e.g., a "flap", a "roof", an extension) that partially overlaps and encloses the current sensor 200. Hence, the support bracket 100 may be designed to adequately allow the current sensor 200 to "slide" in so that it may be positioned for partial enclosure within the support bracket 100. Further, the first surface 120 may include sufficient "flex" (i.e., "spring", tension) to ensure a "snug" fit of the current sensor 200.

In a particular instance, the second surface 130 of the support bracket 100 may include one or more first opening(s) 133 (i.e., through, circumferentially enclosed openings, first opening(s) 133) (e.g., circular holes). The first opening(s) 133 may be used to adjoin portions of the current sensor 200 to the second surface 130 via fastener(s) 334 (e.g., screws, bolts, rods, sockets, etc.) (as shown in FIG. 3). In a particular implementation, the fastener(s) 334 may be inserted through the first opening(s) 133 and into respective openings of the current sensor 200. Additionally, on an opposing side of the second surface 130, at one or more second opening(s) 135 (i.e., through, circumferentially enclosed openings) (e.g., circular holes) of the second surface 130, one or more nut-plate(s) (not shown) or other types of captive fasteners may be affixed to aid the attachment of the fastener(s) used to adjoin the support bracket 100 to the current sensor 200.

In one implementation, the second surface 130 may also include a grounding tab 136 (i.e., one or more grounding tabs 136) that may be "folded-over" to create a bend 166 (i.e., a third right angle 166 establishing a third metal corner 176). Advantageously, the grounding tab 136 may provide electrical power ground paths for the current terminating to the current sensor 200. In particular examples, the grounding tab 136 may include one or more discontinuities 137 (i.e., notches, indentations, "dimples"). The one or more discontinuities 137 may provide increased rigidity to strengthen the bend 166. In other examples (not shown), however, the grounding tab 136 may include sufficient rigidity, and thus, the one or more discontinuities 152 may not be desired. In another implementation (not shown), the grounding tab 136 of the second surface 130 is not "folded-over", but rather extended to contact the chassis 300. In such an implementation, a sufficient surface-to-surface mating area exists such that current may flow unencumbered from the support bracket 100 to the chassis 300.

The grounding tab 136 of the second surface 130 may also include one or more openings 139 (i.e., through, circumferentially enclosed openings) (e.g., circular holes) to receive fasteners 312 (e.g., rivets) connecting the support bracket 100 to the chassis 300. In one example, at least three fasteners 312 are inserted within at least three openings 310 (i.e., through, circumferentially enclosed openings) (e.g., circular holes) of the chassis 300, as well as within the one or more openings of 139 of the second surface 130 of the support bracket 100, respectively. Thus, the support bracket 100 may be both physically and electrically coupled to the chassis 300. In an alternative example (not shown), the grounding tab may be configured to receive a single fastener. Such a grounding tab would be configured to accommodate requisite load path and redundancy.

Advantageously, the first, second, and third surfaces 120, 130, 140 provide a frame structure for current to travel along and through the support bracket 100. Accordingly, the support bracket 100 is configured as an electrical busbar to conduct electricity between end points. Furthermore, the first, second, and third surfaces 120, 130, 140 are configured as grounding terminals, as current from the current sensor 200 may be conducted through these surfaces 120, 130, 140 of the support bracket 100.

Each of the first, second, and third surfaces 120, 130, 140 of the support bracket 100 may be suitably sized with a sufficient cross-sectional area (e.g., length, width, and height dimensions) to carry current (i.e., to provide electrical conduction). For example, if the width of the surfaces of the support bracket 100 were to be reduced, then due to its metal material element (e.g., aluminum), the surfaces 120, 130, 140 of the support bracket 100 would require a greater height (i.e., thickness). Thus, for an entire electrical path, it is desired to maintain a minimum metal material width and thickness such that current can be carried without overheating, deforming, or discoloration of the metal material element.

In one implementation, a cross-sectional area of the first, second, and third surfaces 120, 130, 140 of the support bracket 100 may be substantially equivalent to a cross-sectional area of a wire gauge electrically coupled to the current sensor 200. As an example, the support bracket 100 may be made from aluminum while wires in a feeder cable assembly 410 (as shown in FIG. 3) may be made from copper. Accordingly, a cross-sectional computation may be performed to convert the resistance of copper to that of aluminum. Hence, in this scenario, the aluminum material element, e.g., the support bracket 100, may be designed with a greater cross-sectional area. Moreover, each of the first, second, and third surfaces 120, 130, 140 of the support bracket 100 may include a minimum level of structural integrity to prevent fatigue of the support bracket 100.

In one example, the support bracket 100 may be a flat piece of metal. In such cases, the support bracket 100 may include a single surface that can be attached to the current sensor 200. Moreover, other examples may include support brackets having "Z-shaped" or "S-shaped" metal constructions.

Referring to FIG. 2, a current sensor 200 implementable with the support bracket 100 is shown. As illustrated, the current sensor 200 (i.e., resistive shunt, resistive current sensor, shunt resistor) includes a resistor 210 (i.e., a resistive element) electrically coupled to a conductor 220 (i.e., current-carrying conductor). The current sensor 200 may be configured to allow current from a conducting end of the conductor 220 to pass through the resistive element 210 to another conducting end. The conductor 220 may include, but is not limited to, first and second metal blocks 222, 223 (e.g., alloy blocks made from copper and zinc, first and second brass blocks), first and second fasteners 224, 225 (e.g., bolts, screws, sockets, etc.), first and second washers 226, 227 (e.g., lock washers), and first and second flat washers 228, 229 of the current sensor 200.

The current flowing through the resistive element 210 may be measured through a resulting voltage drop across the resistive element 210. In a particular implementation, the resistive element 210 may be placed in series with the current-carrying conductor 220, such that substantially all of the current flowing through the conductor 220 passes through the resistive element 210. Alternatively, the resistive element 210 may be placed in parallel with the current-carrying conductor 220, such that the resistive element 210 "shunts" (e.g., diverts, shifts) the current away from the conductor 220. The resistive shunt 200 may measure both AC or DC currents of 600 A or more.

A family of resistive shunts may have different current ratings but still have the same physical dimensions. Advantageously, the support bracket 100 may be designed such that the physical dimensions of the particular family of resistive shunts can be fitted within the partial enclosure of the support bracket 100.

Referring to FIG. 3, a system 1000 to ground a current sensor 200 is shown. The system 1000 may include, but is not limited to, the support bracket 100, the current sensor 200, the chassis 300, and a feeder cable assembly 410.

As mentioned above, the support bracket 100 and the current sensor 200 may be affixed and electrically coupled by adjoining the second fastener 225, the second washer 227, and the flat washer 229 to the first opening 124 of the first surface 120 of the support bracket 100.

As discussed with reference to FIG. 1, in a particular implementation, the support bracket 100 and the chassis 300 may be affixed and electrically coupled by adjoining fastener(s) 312 through the opening(s) 310 of the chassis 300, and within the opening(s) of the grounding tab 136 of the support bracket 100, respectively. One skilled in the art would appreciate that joining these components can be accomplished through other means of affixing and electrically coupling, including, but not limited to, more or fewer fasteners, tac welding, brazing, bonding using electrically conductive adhesives, etc.

Also, as discussed with reference to FIG. 1, in some instances, the support bracket 100 and the current sensor 200 may be affixed by adjoining fasteners 334 through the opening(s) 133 (i.e., one or more first openings 133) of the second surface 130 of the support bracket 100 and into respective opening(s) of the current sensor 200. Accordingly, as an advantage in certain implementations, the current sensor 200 may not necessitate contact with the chassis 300, but yet, through the support bracket 100, the current sensor 200 may still be adjoined to the chassis 300.

In an example grounding operation, current conducting between a power source (not shown) (e.g., a power generator) and the vehicle chassis 300 may be transmitted through a power feeder 410 adjoined to a conducting end (i.e., a second conducting end) of the current sensor 200. The current may be "shunted" within the current sensor 200, such that it may be transmitted between the second metal block 223 and the first metal block 222. From the first metal block 222 at another conducting end (i.e., a first conducting end) of the current sensor, the current may be conducted to, and from, the first surface 120 such that the current may be transmitted from one end of the support bracket 100 to another end. Also, the current may be transmitted through the at least one grounding tab 136 of the support bracket 100 to be grounded at the vehicle chassis 300.

Figure 4:
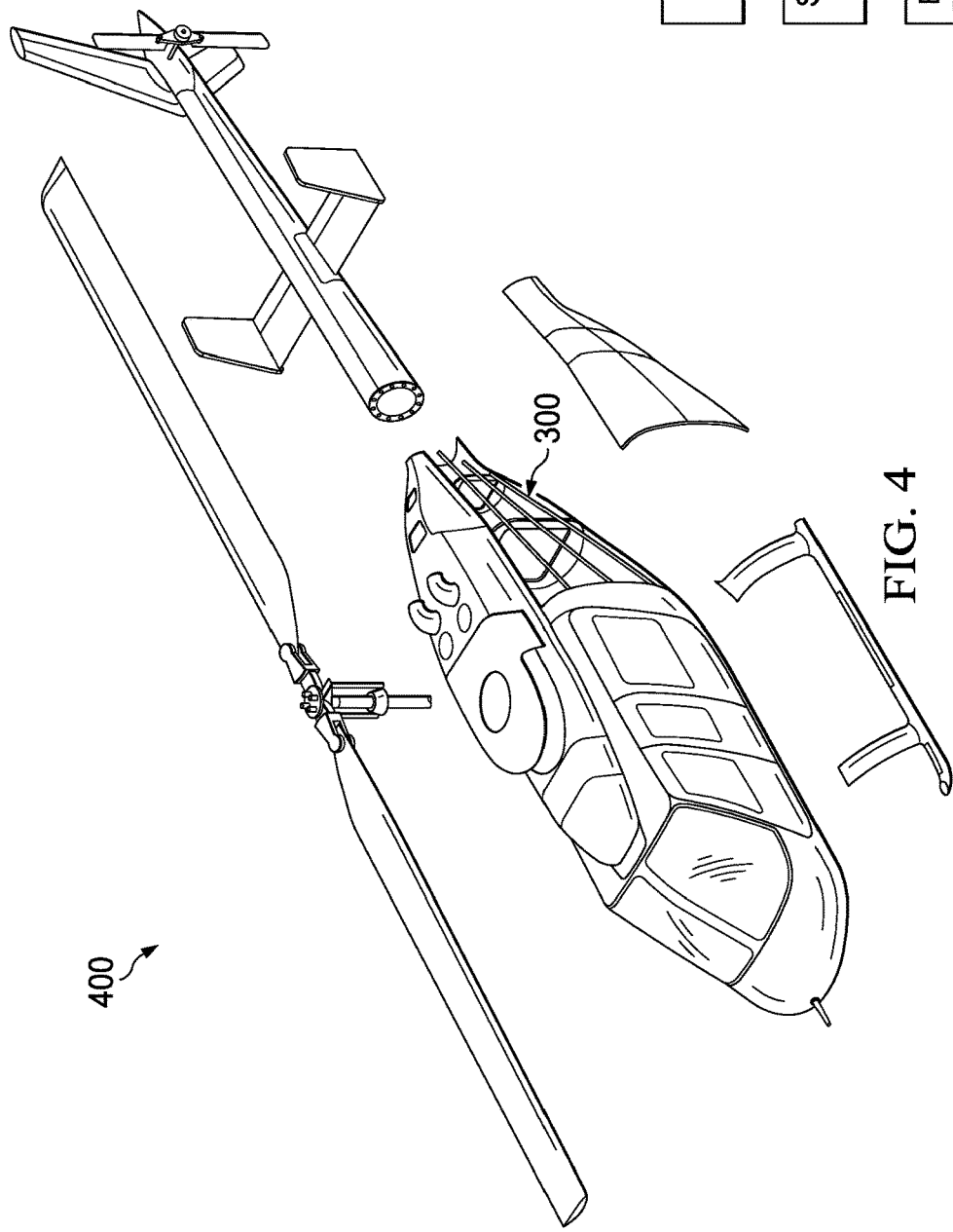
FIG. 4 illustrate an example rotorcraft in accordance with implementations of various techniques herein.

Referring to FIG. 4, the vehicle chassis 300 of an example rotorcraft 400 is shown. As illustrated in FIG. 4A, the vehicle chassis (i.e., chassis) 300 is shown among various other sections (e.g., fuselage, transmission, main rotor system, tail rotor system) of the example rotorcraft 400.

The chassis 300 is the grounding structure of an aircraft (e.g., helicopter, airplane, etc.) and can be any part of the main metal structure. In certain examples, the chassis 300 may be made from metal materials (e.g., aluminum alloy). Tubular and sheet metal substructures of the chassis may also be made primarily of aluminum, although stainless steel or titanium may be used in areas subject to higher stress or heat.

Figure 5:
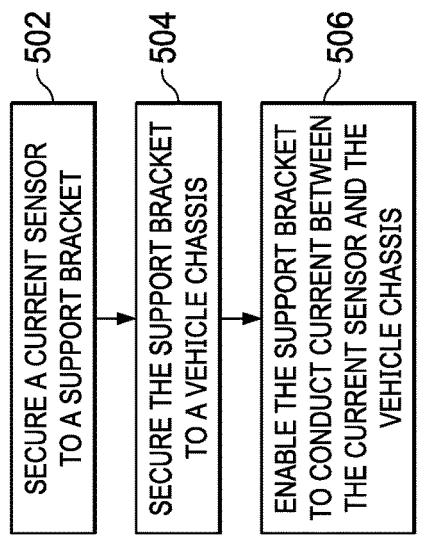
FIG. 5 is a flowchart of a method of grounding a current sensor in accordance with implementations of various techniques described herein.

FIG. 5 is a flowchart of a method of grounding a current sensor in accordance with implementations of various techniques described herein. Method 2000 may be performed by the system 1000 including the support bracket 100, the current sensor 200, and the chassis 300 of FIGS. 1-5.

At 502, the method 2000 includes securing a current sensor to a support bracket. For example, as described with reference to FIG. 3, the current sensor 200 may be affixed to the support bracket 100 by adjoining a second fastener 225, a second washer 227, and a second flat washer 229 of the current sensor 200 to a first opening 124 of a first surface 120 of the support bracket 100. The current sensor 200 may also be affixed to the support bracket 100 by adjoining fasteners 334 through at least two openings 133 of a second surface 130 of the support bracket 100 and into respective openings of the current sensor 200.

At 504, the support bracket is secured to a chassis. For example, as described with reference to FIGS. 1 and 3, the support bracket 100 may be affixed to the chassis 300 by adjoining a least three fasteners 312 through at least three openings 310 of the chassis 300, and within the one or more grounding tabs 136 of the support bracket 100, respectively.

At 506, the support bracket is used to conduct current between the current sensor and the chassis. For example, as described with reference to FIG. 4, as a conducting busbar, the support bracket 100 allows for current to be conducted from the current sensor 200 to the chassis 300 via the first, second, and third surfaces of the support bracket 100. In another example, current may flow from the chassis 300 through the current sensor 200, and ultimately to a power generator (not shown).

Each of the processes of illustrative method 2000 may be performed or carried out by a system integrator, a third party, and/or an operator (e.g., a customer). For the purposes of this description, a system integrator may include, without limitation, any number of manufacturers and major-system subcontractors; a third party may include, without limitation, any number of vendors, subcontractors, and suppliers; and an operator may be a leasing company, military entity, service organization, and so on.

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first", "second", etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

Illustrative, non-exhaustive examples, which may or may not be claimed, of the subject matter according to the present disclosure are provided below.

Apparatus(es) and method(s) shown or described herein may be employed during any one or more of the stages of the installation of the support bracket 100, the current sensor 200, the chassis 300 and the method 2000.

Different examples of the apparatus(es) and method(s) disclosed herein include a variety of components, features, and functionalities. It should be understood that the various examples of the apparatus(es) and method(s) disclosed herein may include any of the components, features, and functionalities of any of the other examples of the apparatus(es) and method(s) disclosed herein in any combination, and all of such possibilities are intended to be within the scope of the present disclosure.

Many modifications of examples set forth herein will come to mind to one skilled in the art to which the present disclosure pertains having the benefit of the teachings presented in the foregoing descriptions and the associated drawings.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

What is claimed is:

1. A support bracket comprising:
   a first surface electrically coupled to a current sensor in order to provide a current path to ground the current sensor; and
   a second surface physically coupled to the current sensor in order to support the current sensor;
   wherein the support bracket is unitary, configured to at least partially enclose the current sensor and is configured to be connected to a vehicle chassis.

2. The support bracket of claim 1, wherein the first surface defines an opening configured to receive a fastener to adjoin and electrically couple a first conducting end of the current sensor to the first surface.

3. The support bracket of claim 1, further comprising:
   a third surface adjoining the first surface and second surface, wherein the third surface forms a first bend at an intersection of the first surface and forms a second bend at an intersection of the second surface.

4. The support bracket of claim 1, wherein the first and second surfaces are configured as first and second electrical conductors of an electrical busbar and as grounding terminals.

5. The support bracket of claim 1, wherein the second surface is physically and electrically coupled to the vehicle chassis.

6. The support bracket of claim 5, wherein the second surface comprises a grounding tab configured to receive one or more fasteners to adjoin and electrically couple the second surface to the vehicle chassis.

7. The support bracket of claim 1, wherein the second surface defines one or more openings configured to receive one or more fasteners, respectively, to adjoin the current sensor to the second surface.

8. The support bracket of claim 7, wherein the fasteners comprise nut plates.

9. The support bracket of claim 1, wherein a cross-sectional area of the first and second surfaces has substantially the same current-carrying capacity as a feeder cable assembly electrically coupled to the current sensor.

10. A system comprising:
    a vehicle chassis;
    a current sensor; and
    a support bracket physically and electrically coupling the current sensor to the vehicle chassis in order to support and provide a current path to ground the current sensor,
    wherein the support bracket is unitary, at least partially encloses the current sensor and is connected to the vehicle chassis.

11. The system of claim 10, further comprising:
    a feeder cable assembly coupled to the current sensor and configured to transfer current from a power source to the current sensor.

12. The system of claim 10, wherein the support bracket comprises:
    a first surface; and
    a second surface that comprises a portion that is substantially parallel to the first surface, wherein the first and second surfaces are coupled to opposing sides of the current sensor.

13. The system of claim 12, wherein the second surface comprises a grounding tab configured to receive one or more fasteners to adjoin and electrically couple the second surface to the vehicle chassis.

14. The system of claim 12, wherein the second surface defines one or more openings configured to receive one or more fasteners, respectively, to adjoin the current sensor to the second surface.

15. The system of claim 14, wherein the fasteners comprise nut plates.

16. The system of claim 12, wherein the first surface of the support bracket defines an opening configured to receive a fastener to adjoin and electrically couple a first conducting end of the current sensor to the first surface of the support bracket.

17. The system of claim 12, wherein the support bracket further comprises a third surface to adjoin the first surface and second surface, and wherein the third surface forms a first bend at an intersection of the first surface and forms a second bend at an intersection of the second surface.

18. A method of grounding a current sensor, the method comprising:

securing the current sensor to a support bracket;
securing the support bracket to a vehicle chassis; and
enabling the support bracket to conduct current between the current sensor and the vehicle chassis,
wherein the support bracket is unitary and at least partially encloses the current sensor.

19. The method of claim 18, wherein securing the current sensor to the support bracket comprises inserting the current sensor in between first and second surfaces of the support bracket and affixing the current sensor to the support bracket.

20. The method of claim 19, wherein affixing the current sensor to the support bracket comprises adjoining an opening of the support bracket to a portion of the current sensor via a fastener.

21. The method of claim 18, wherein securing the support bracket to the vehicle chassis comprises adjoining one or more grounding tabs of the support bracket to the vehicle chassis via a fastener.

* * * * *